United States Patent [19]

Knowles

[11] Patent Number: 5,072,427

[45] Date of Patent: Dec. 10, 1991

[54] ACOUSTIC TOUCH POSITION SENSOR WITH SHEAR TO LAMB WAVE CONVERSION

[75] Inventor: Terence J. Knowles, Hanover Park, Ill.

[73] Assignee: Exzec Inc., Evanston, Ill.

[21] Appl. No.: 614,494

[22] Filed: Nov. 16, 1990

[51] Int. Cl.$^5$ ............................................. H04N 1/00
[52] U.S. Cl. .................................. 367/118; 367/907; 367/127; 178/18
[58] Field of Search ...................... 367/907, 118, 129; 178/18; 310/313 R, 313 D; 340/712

[56] References Cited

U.S. PATENT DOCUMENTS

| | | | |
|---|---|---|---|
| 3,673,327 | 6/1972 | Johnson et al. | 178/18 |
| 3,883,831 | 5/1975 | Williamson et al. | 333/30 |
| 4,642,423 | 2/1987 | Adler | 178/18 |
| 4,644,100 | 2/1987 | Brenner | 178/18 |
| 4,645,870 | 2/1987 | Adler | 367/907 |
| 4,700,176 | 10/1987 | Adler | 178/18 |
| 4,746,914 | 5/1988 | Adler | 178/18 |
| 4,791,416 | 12/1988 | Adler | 178/18 |
| 4,880,665 | 11/1989 | Adler et al. | 427/126.1 |

OTHER PUBLICATIONS

"The IMCON Pulse Compression Filter and its Application," Tom A. Martin, *IEEE Transactions on Microwave Theory and Techniques*, vol. MTT-21, No. 4, Apr. 1973.
"Ultrasonic Delay Lines Using Shear Modes in Strips," A. H. Meitzler, *IRE Transactions on Ultrasonics Engineering*, Jun. 1960.
"The Use of Surface-Elastic-Wave Reflective Gratings in Large Time-Bandwidth Pulse-Compression Filters," Richard C. Williamson and Henry I. Smith, *IEEE Transactions on Microwave Theory and Techniques*, vol. MTT-21, No. 4, Apr. 1973.
"Large-Time-Bandwidth-Product Surface Wave Pulse Compressor Employing Reflective Gratings," R. C. Williamson et al., *Electronics Letters*, vol. 8, No. 16, Aug. 10, 1972.
"A Closed-Form Analysis of Reflective-Array Gratings," P. V. Wright, *IEEE Ultrasoncis Symposium*, 1980.
"An Economical Touch Panel Using SAW Absorption," Robert Adler, and Peter J. Desmares, *IEEE Transactions on Ultrasonics, Perroelectrics, and Frequency Control*, vol. UFFC-34, No. 2, Mar. 1987.
"Mechanical Input Admittance of Ultrasonic Delay Lines Operating in Torsional or Shear Modes," Morio Onoe, *The Journal of the Acoustical Society of America*, vol. 35, No. 7, pp. 1003-1008, Jul. 1963.
"On Waves in an Elastic Plate," Horace Lamb, F.R.S., (Received Jul. 10, 1916).
*Physical Acoustics—Principles and Methods*, Warren P. Mason, Academic Press, vol. 1-Part A, Chapter 2 and 6; 1964.
*Rayleigh and Lamb Waves—Physical Theory and Applications*, Igor Aleksandrovich Viktorov, 1967.

*Primary Examiner*—Daniel T. Pihulic
*Attorney, Agent, or Firm*—McAndrews, Held & Malloy, Ltd.

[57] ABSTRACT

An acoustic touch position sensor is shown wherein a transducer coupled to a side of a substrate imparts a shear wave into the substrate that propagates along a first axis. A shear to Lamb wave converting array disposed along the first axis converts the shear wave to Lamb waves propagating along a plurality of parallel paths where each path is associated with a different axial position on the substrate relative to the first axis. The Lamb waves are converted back to shear waves by a Lamb to shear wave converting array disposed along an axis parallel to the first axis, the second converting array being spaced across a touch surface of the substrate from the first array. The shear wave from the second converting propagate to a receiving transducer that provides a signal representative of the waves. A touch on the substrate results in a partial absorption of the energy in the Lamb wave propagating along a path intersection the touch position so as to produce a perturbation therein which is sensed to determine the axial position of the touch on the substrate. In a second embodiment a single transducer and reflective array is provided for each axis, a coordinate on which is to be determined. In a third embodiment of the present invention, a single transducer is provided for two axes.

80 Claims, 8 Drawing Sheets

ACOUSTIC TOUCH POSITION SENSOR WITH SHEAR TO LAMB WAVE CONVERSION

CROSS REFERENCE TO RELATED APPLICATION

This application is related to co-pending application Ser. Nos. 07/615,030 and 07/614,860, both filed Nov. 16, 1990 in the name of Terence J. Knowles.

TECHNICAL FIELD

The present invention relates to an acoustic touch position sensor and more particularly to such a sensor wherein a shear wave is imparted to a substrate for propagation along an axis of a converting array that converts portions of the shear wave to either symmetric mode Lamb waves or anti-symmetric mode Lamb waves propagating in the substrate along a plurality of paths of differing lengths where each path is associated with a different axial position on the substrate. A touch on the substrate results in a partial absorption of energy so as to produce a perturbation in the Lamb wave propagating along a path intersecting the position of the touch, the perturbation being sensed to determine the axial position of the touch on the substrate.

BACKGROUND OF THE INVENTION

Acoustic touch position sensors are known to include a touch plate and two or more transducers each of which imparts a surface acoustic wave that propagates along an axis on which a reflective grating is disposed to reflect portions of the surface acoustic wave along plural parallel paths of differing lengths. The reflective gratings associated with the respective transducers are disposed on perpendicular axes so as to provide a grid pattern to enable coordinates of a touch on the plate to be determined. Acoustic touch position sensors of this type are shown in U.S. Pat. Nos. 4,642,423, 4,644,100, 4,645,870, 4,700,176, 4,746,914 and 4,791,416.

Acoustic touch position sensors utilizing surface acoustic waves as taught by the above-mentioned patents have a number of problems which are more readily understood when the nature of the surface acoustic wave used in these sensors is considered. Surface acoustic waves are shown in FIGS. 1A-D propagating in the X direction. Surface acoustic waves have an X component and a Z component such that the particles of a surface acoustic wave move elliptically in the X, Z plane. Although surface acoustic waves have a Z component, the disturbance of particles in the plate created by a surface acoustic wave decays rapidly in the −Z direction so that the wave energy is essentially confined to the surface of the plate.

More precisely, waves in a uniform, non-piezoelectric medium of finite thickness that are confined to a single surface are termed quasi-Rayleigh waves, since true Rayleigh waves exist only in an infinitely thick propagating medium. A Rayleigh/quasi-Rayleigh wave is shown more particularly in FIG. 1D. In order to provide such a wave, the thickness of the touch plate must be at least three to four times the wavelength of the wave imparted into the substrate wherein the length of the touch plate is also limited. If the thickness of the touch plate is for example two wavelengths or less, Lamb waves will be generated in the touch plate instead of Rayleigh waves. Lamb waves are dispersive waves, varying in phase and group velocities. A touch plate in accordance with the teachings of the above-mentioned patents would not work in such a thin plate because Rayleigh or quasi-Rayleigh waves cannot exist therein. However, for a panel having a thickness that is at least three to four times the wavelength of the wave propagating therein, nearer the source of the wave, i.e. the transducer, the symmetric and anti-symmetric Lamb waves appear to be in phase As seen in FIGS. 1E and 1F, the symmetrical and anti-symmetrical Lamb waves are not confined to a single surface of the touch plate but extend through the plate to the opposite surface thereof When in phase, however, the symmetric and anti-symmetric Lamb waves add to produce a quasi-Rayleigh wave as can be seen from a comparison of FIGS. 1E and 1F to FIG. 1D. As the Lamb waves travel farther from the transducer, due to the differing phases and velocities of the Lamb waves, there is a complete transference of wave energy from the top surface of the touch plate on which the transducer is mounted, to the bottom surface of the touch plate. This transference of energy between top and bottom surfaces occurs at regularly spaced intervals making a touch plate having a dimension large enough for this transference of energy to occur unsuitable for a touch position sensor.

From the above it is seen that touch position sensors as shown in the above-mentioned patents utilizing surface acoustic waves and more particularly quasi-Rayleigh waves, as is necessary for the sensors to operate, are limited to relatively thick panels, i.e. panels having a thickness of three to four times the wavelength of the surface acoustic wave propagating therein. Although the wavelength of the propagating wave may be reduced by reducing the frequency of the drive signal applied to the transducer, as the wavelength of the wave is reduced, transference of energy between the top and bottom surfaces of the touch plate occurs closer to the transducer so as to limit the size of the touch plate.

Further, because surface acoustic waves are confined to the surface of the touch plate, contaminants or other materials abutting the plate may create shadows or blind spots extending along the axes of the plate that intersect the contaminant or abutting material. The blind spots or shadows are created by a total or near total absorption of the wave energy by the contaminant or abutting material so that the touch position sensor cannot detect a touch if one of its coordinates is on a blinded axis. Substantial losses in wave energy over time as a result of air damping of the surface acoustic wave is also significant since surface acoustic waves are confined to the surface of the touch plate. The energy losses due to air damping further limit the size of the touch plate.

As shown in FIGS. 1A and C, surface acoustic waves are imparted into a touch plate utilizing a transducer mounted on a wedge that is in turn mounted on the touch surface of the plate wherein the transducer vibrates in the direction shown to produce a compressional bulk wave that propagates in the wedge to impart a surface acoustic wave in the touch plate. This type of wave generating device has several drawbacks. Because the device must convert a compressional bulk wave to a surface acoustic wave, the efficiency of the device is not as high as if the waves in the wedge were of the same type as those imparted into the plate. Also, because the wedge extends above the plate, it must be accommodated for in mounting the plate. Wedges are typically made of plastic thus creating a difficulty in bonding the wedge to a glass plate. Further, the transducer must be bonded to the wedge and the wedge then bonded to the touch plate. Because problems with reliability increase with the number of bonds required, this surface acoustic wave generating device is not as reliable as other wave generating devices requiring fewer bonds.

Although acoustic waves other than surface acoustic wave can propagate in a solid, such waves including Lamb waves and shear waves, heretofore these other acoustic waves were thought to be unsuitable for a touch position sensor Lamb waves were thought unsuitable because they are dispersive, varying in phase and velocity, so as to interfere with one another. Shear waves were thought unsuitable because a touch on a plate in which shear waves are propagating absorbs only a small percentage of the total shear wave energy whereas a touch on a plate in which a surface acoustic wave is propagating absorbs a much greater percentage of the surface acoustic wave energy. More particularly, the percentage of total energy absorbed by a given touch is ten times greater for a surface acoustic wave than it is for a shear wave. Since shear waves are not nearly as responsive to touch as surface acoustic waves, shear waves were not thought practical for a touch position sensor.

SUMMARY OF THE INVENTION

In accordance with the present invention, the disadvantages of prior acoustic touch position sensors as discussed above have been overcome. The touch position sensor of the present invention utilizes a shear wave that is imparted into a substrate for propagation along the axis of a converting array wherein the converting array converts portions of the shear wave to either symmetric mode Lamb waves or anti-symmetric mode Lamb waves propagating along a plurality of parallel paths of differing lengths, each path representing a different axial position. A touch on the substrate forms a perturbation in the Lamb wave propagating along a path intersecting the position of the touch, the time of occurrence of the perturbation being sensed to determine the axial position of the touch on the substrate.

In accordance with the present invention a transducer is employed to impart the shear wave into the substrate. The transducer may be bonded directing on to a side of the substrate such that an electrical signal induces a shear wave in the transducer that is coupled thereby directly to the substrate to generate the shear waves in a very efficient manner. A conductive frit may be used to bond the transducer to the substrate wherein the frit provides a contact for the transducer. The conductive frit may also be used to reduce the number of wires necessary for the operation of the sensor.

Further, the use of Lamb waves provides the touch position sensor of the present invention with additional advantages. First, Lamb waves are very fractionally sensitive to touch. That is, the percentage of the total Lamb wave energy absorbed by a touch is similar to the percentage of the total Rayleigh/quasi-Rayleigh wave energy absorbed by a touch. However, unlike Rayleigh-/quasi-Rayleigh waves, the Lamb waves utilized in the present invention may propagate in thin substrates. Therefore, virtually the only limit on the thinness of the touch plate of the present invention is its structural integrity making it extremely practical for applications where the weight of the touch sensor must be minimized.

The shear to Lamb wave converting means of the present invention includes a first array of converting elements disposed on the substrate along a first axis perpendicular to the side of the substrate on which the transducer is bonded, the converting elements convert portions of the shear wave incident thereto to Lamb waves having a symmetric mode and an anti-symmetric mode. The converting means also includes a second array of converting elements that are disposed on a surface of the substrate that is opposite to the surface on which the first array of converting elements are disposed. The second array of converting elements are aligned with respect to the elements in the first array to suppress either the symmetric mode or the anti-symmetric mode so that only one of the modes propagates along the parallel paths that extend across the touch surface of the substrate. Because one of the Lamb wave modes is suppressed, There is little or no interference with the other Lamb wave mode, making the Lamb waves suitable for a touch position sensor.

In order to suppress the anti-symmetric mode, the elements of the second converting array are aligned with the elements of the first converting array. To suppress the symmetric mode Lamb waves, the second array of converting elements are shifted relative to the first array of converting elements by an amount that is approximately equal to the wavelength of a symmetric mode Lamb wave divided by two. In the preferred embodiment of the present invention, it is the symmetric mode Lamb waves which are suppressed wherein the thickness of the substrate is set equal to a value for which the phase velocity of the shear wave propagating along the axis of the converting array is equal to the phase velocity of the symmetric Lamb wave so as to cancel both the shear wave and the symmetric mode Lamb wave.

In order to determine the position of a touch along a second axis that is generally perpendicular to the first axis, a second converting means is provided for converting portions of a shear wave along second parallel paths extending across the touch surface of the substrate, each of these second paths representing a different axial position relative to the axis of the second converting means wherein the second axis is generally perpendicular to the axis of the first converting means A touch on the substrate surface forms a perturbation in the Lamb waves propagating along a second path intersecting the position of the touch wherein the time of occurrence of the perturbation is determined to in turn determine the axial position of the touch on the substrate relative to the second axis.

In one embodiment of the present invention, two separate converting means are provided for each axis for which the position of a touch is to be determined relative to. More particularly, the first converting means extends along a first axis for converting portions of a shear wave to Lamb waves propagating along parallel paths extending across the surface of the substrate to the second converting means. The second converting means extends along an axis parallel to the first axis and converts the Lamb waves incident thereto into shear waves propagating along the axis of the second converting array to a receiving transducer that is coupled to the same side of the substrate as the transmitting transducer. When the position of a touch relative to two axes is to be determined, with this embodiment four converting means are employed.

In another embodiment of the present invention only a single converting means is required for each axis for which the position of a touch is to be determined relative to. More particularly, the first converting means converts a shear wave propagating along its axis from a transducer to Lamb waves propagating along parallel paths extending across the touch surface of the substrate to a reflective edge of the substrate. The reflective substrate edge reflects the Lamb waves back along the first parallel paths to the first converting means which converts the reflected Lamb waves to shear waves propagating along the axis of the converting means back to the transducer. The transducer in this embodiment functions not only as a transmitting transducer that imparts the shear wave into the substrate but also functions as a receiving transducer for sensing shear waves propagating thereto to provide a signal representative of the shear to the position determining means.

One transducer to transmit and receive shear waves may be provided for each axis for which a touch coordinate is to be determined. Alternatively, a single transducer may be provided for transmitting and receiving a shear wave that propagates on two axes wherein a means is provided that intersects both axes for reflecting the shear wave propagating along the first axis of the first converting means to the second axis of the second converting means and visa versa.

These and other objects, advantages and novel features of the present invention, as well as details of an illustrated embodiment thereof, will be more fully understood from the following description and the drawing.

DETAILED DESCRIPTION OF THE PREFERRED EMBODIMENT

Figure 1A:
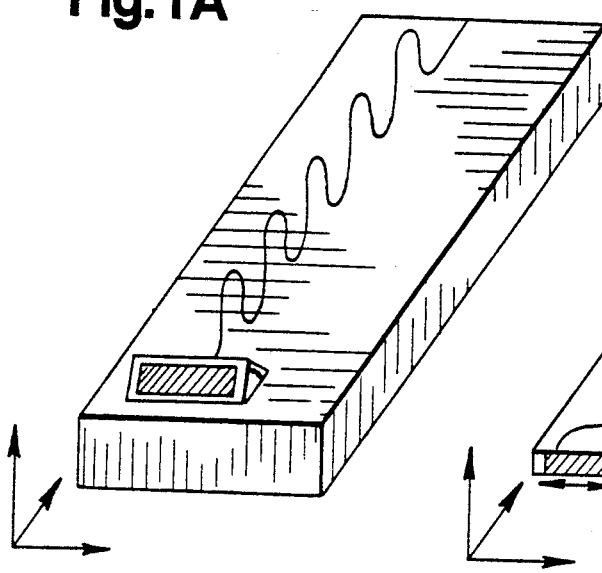
FIG. 1A is a perspective view of a prior art surface acoustic wave propagating plate.
Figure 2A:
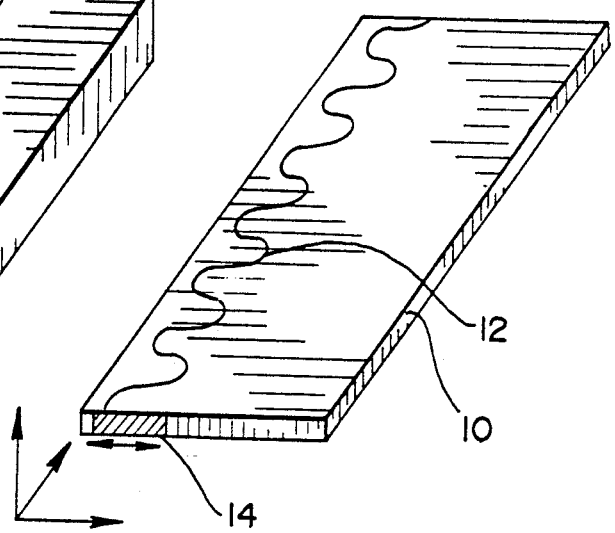
FIG. 2A is a perspective view of a shear wave propagating plate.
Figure 1B:
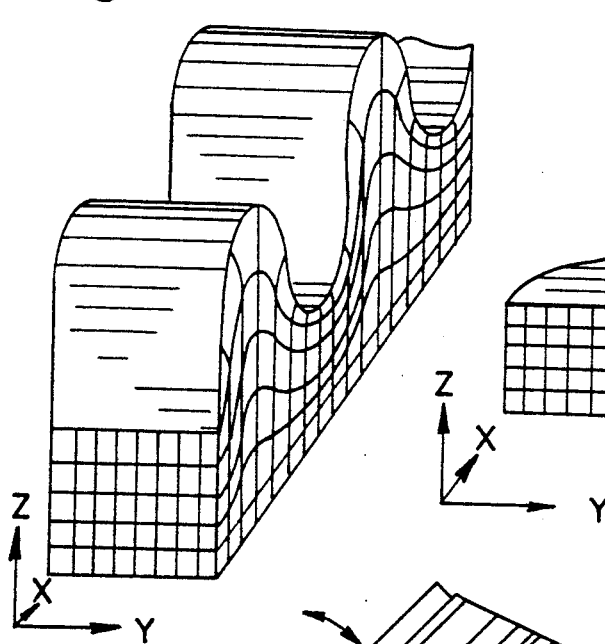
FIG. 1B is a greatly exaggerated perspective view of a surface acoustic wave traveling in the prior plate of FIG. 1A.
Figure 2B:
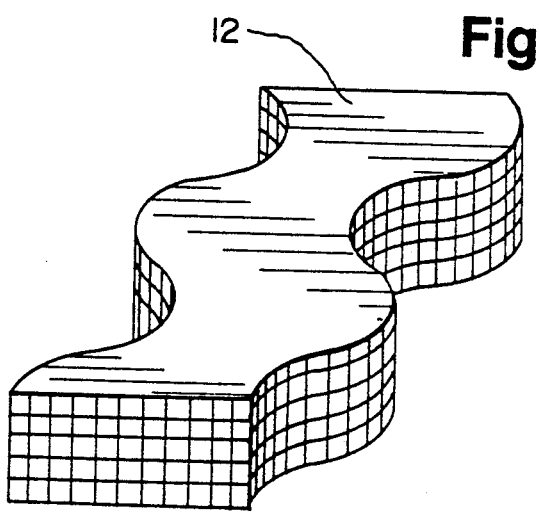
FIG. 2B is a greatly exaggerated perspective view of a shear wave traveling in the plate of FIG. 2A.
Figure 1C:
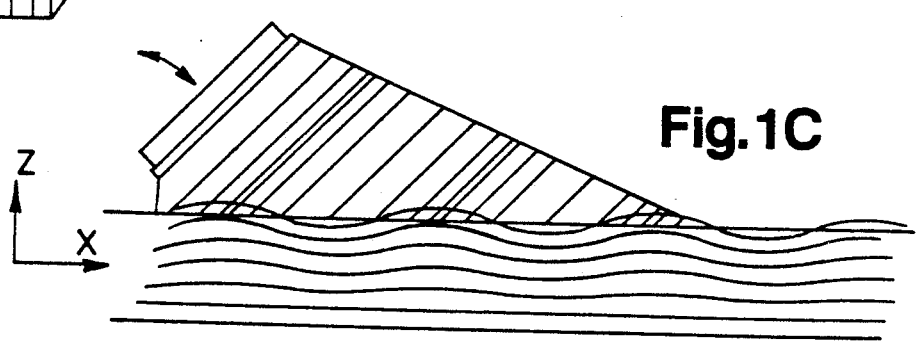
FIG. 1C is a side cross-sectional view of the prior art plate shown in FIG. 1A illustrating the nature of the waves generated in the plate.
Figure 1D:
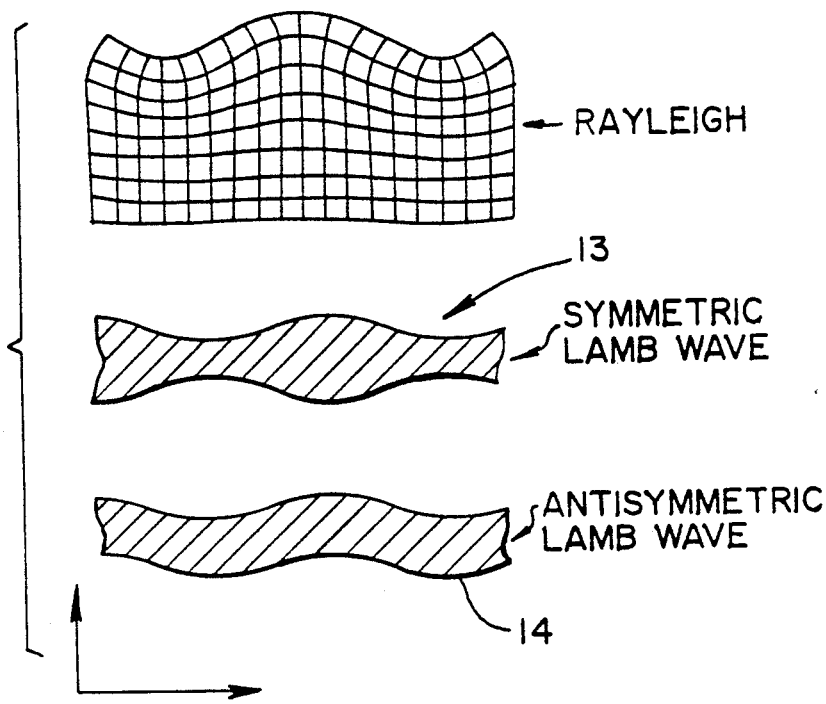
FIG. 1D is an illustration of a Rayleigh wave, a symmetric Lamb wave and an anti-symmetric Lamb wave.

The touch position sensor of the present invention includes a substrate 10 that is capable of propagating a shear wave 12 as shown in FIGS. 2A and 2B and that is capable of propagating Lamb waves 13 and 14 as shown in FIG. 1D. The substrate 10 may be formed of tempered or frosted glass, plastic, metal or ceramic. The substrate 10 may further be formed as a flat plate as shown or the substrate may be curved. In order to induce a shear wave propagating in the X direction, a piezoelectric transducer 14 is bonded on to an edge of the substrate perpendicular to the axis of propagation, X. The transducer 14 is responsive to a drive signal for vibrating along the Y axis wherein a shear wave 12 is induced in the transducer 14 and coupled thereby directly to the substrate 10. As shown in FIG. 2B, the shear wave 12 imparted into the substrate 10 is not confined to a single surface of the substrate 10, but extends throughout the entire thickness of the substrate 10. The particles of the shear wave move only in the Y direction. The shear wave 12 has no displacement components in the X or Z directions. It is noted that shear waves may be symmetric or anti-symmetric about the median plane. In the preferred embodiment of the present invention a nondispersive mode shear wave is employed. More particularly, this nondispersive mode is the zeroth order of the following plate solution:

$$U_y = AH(\cos \beta x) \exp i(\gamma z - \omega t). \qquad \text{eq. 1}$$

This shear wave is designated herein as the Zeroth Order Horizontally Polarized Shear wave or a Zohps wave.

Figure 3:
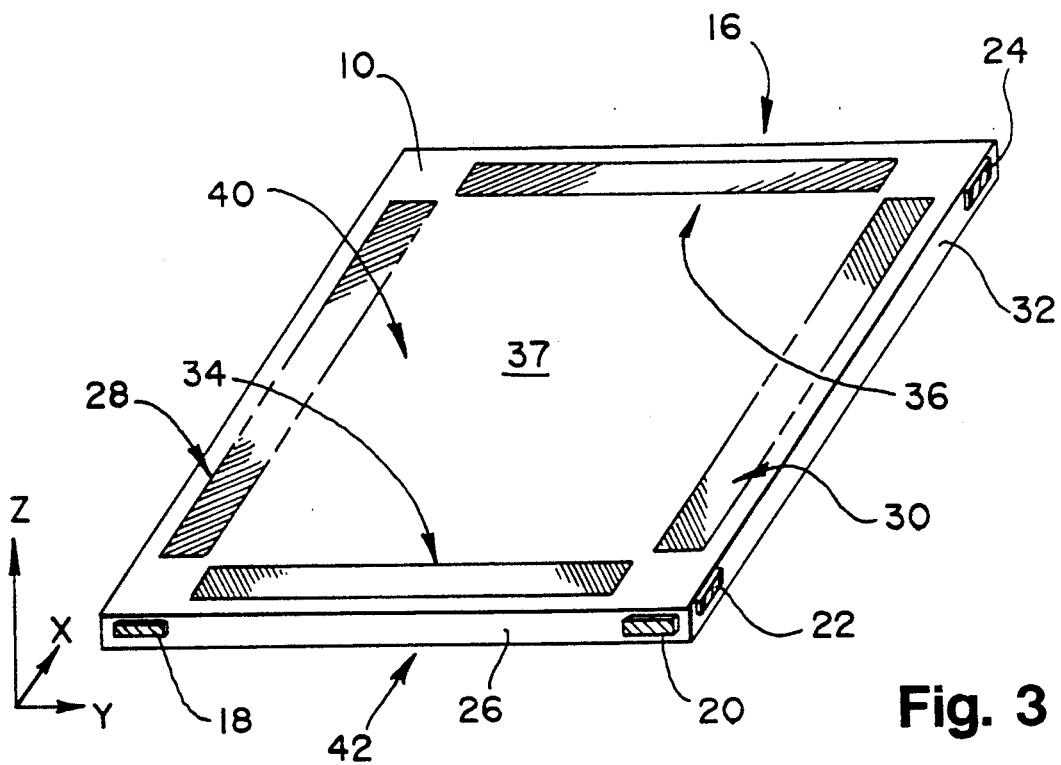
FIG. 3 is a perspective view of an acoustic touch position sensor with shear to Lamb wave conversion in accordance with a first embodiment of the present invention.

A touch position sensor 16 in accordance with a first embodiment of the present invention is shown in FIG. 3 having a pair of transmitting and receiving transducers 18, 20 and 22, 24 associated with each axis for which a coordinate is desired to be determined. Although the touch position sensor 16 has four transducers 18, 20 and 22, 24 respectively associated with the X axis and Y axis so that both X and Y coordinates of a touch may be determined, if only a single coordinate is desired, for example a coordinate along the X axis, then the transducers 22 and 24 associated with the Y axis may be eliminated.

The piezoelectric transducers 18, 20, 22 and 24 are bonded on to the sides 26 and 32 of the substrate 10 by means of a conductive frit. The conductive frit forms a contact that may extend around the corner of the substrate 10 between the transducers 20 and 22 to eliminate the need for separate ground wires connected to these two adjacent transducers. The height of the transducers 18, 20, 22 and 24 and the height of the conductive frits bonding the transducers to the substrate 10 are equal to the thickness of the substrate 10 so that only the fundamental mode of the shear wave is generated in the substrate 10. The piezoelectric transducers 18, 20, 22 and 24 are thin so as not to protrude outwardly from the sides 26 and 32 of the substrate to any appreciable extent. Further, since the transducers do not protrude above or below the top or bottom surfaces 40 and 42 of the substrate 10, the substrate 10 may be mounted in any fixture accommodating a plate of the same size without making special accommodations for the transducers.

In order to define the X axis, the X transmitting transducer 18 vibrates along the Y axis to impart a shear wave that travels along the X axis to a pair of shear to Lamb wave converting arrays 28 and 29 are disposed on respective top and bottom surfaces 40 and 42 of the substrate 10. The top and bottom shear to Lamb converting arrays 28 and 29 are such as to convert portions of a shear wave propagating along the axis of the arrays into either anti-symmetric Lamb waves 14 or symmetric Lamb waves 13 propagating along a plurality of parallel paths. The parallel paths extend in the Y direction across the touch surface 37 of the substrate perpendicular to the axis of the arrays 28 and 29 to a Lamb to shear converting array 30. Each of the parallel paths extending in the Y direction represents a different axial position with respect to the X axis as discussed below. The Lamb to shear wave converting array 30 converts Lamb waves propagating in a direction perpendicular to the array 30 into shear waves that propagate along the axis of the array 30 to the receiving transducer 20 mounted on the side 26 of the substrate 10. The receiving transducer is responsive to shear waves propagating thereto along the axis of the array 30 to generate a signal representative thereof as discussed below.

Similarly, in order to define the Y axis, the Y transmitting transducer 22 vibrates along the X axis to impart a shear wave that travels along the Y axis to a pair of shear to Lamb converting arrays 34 and 35 that are disposed on the top and bottom surfaces 40 and 42 of the substrate 10. The top and bottom shear to Lamb converting arrays 34, 35 are such as to convert portions of a shear wave propagating along the axis of the arrays into either anti-symmetric Lamb waves 14 or symmetric Lamb waves 13 propagating along a plurality of parallel paths that extend across the touch surface 37 of the substrate perpendicular of the axes of the arrays 34 and 35 to a Lamb to shear converting array 36. Each of the parallel paths extending across the touch surface of the substrate in the X direction represent a different axial position with respect to the Y axis as discussed below. The Lamb to shear converting array 36 converts the Lamb waves propagating incident thereto into shear waves that propagate along the axis of the array 36 to the receiving transducer 24 mounted on the side 32 of the substrate 10.

Figure 4:
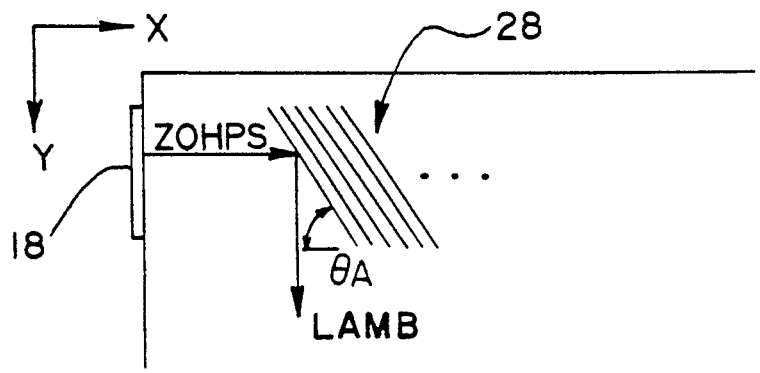
FIG. 4 is a partial top view of the sensor shown in FIG. 3.

In order to convert a shear wave and more particularly a Zohps wave into a particular Lamb wave, each of the converting elements is positioned at an angle $\theta_A$ with respect to the axis of the converting array wherein the converting array axis is perpendicular to the direction of vibration of the associated transmitting or receiving transducer as shown in FIG. 4. More particularly, for the converting arrays 28, 29 and 30 the angle $\theta_A$ of the converting elements with respect to the X axis is as follows:

$$\theta_A = \arctan(V_L/V_Z) \qquad \text{eq. 2}$$

Where $V_L$ is the phase velocity of the desired Lamb wave and $V_Z$ is the phase velocity of the Zohps wave propagating along the axis of the array 28, 29 from the transmitting transducer 18 as well as the phase velocity of the Zohps wave propagating along the axis of the array 30 towards the receiving transducer 20. Similarly, the angle $\theta_A$ of the converting elements in the arrays 34, 35 and 36 with respect to the Y axis is defined by the same equation.

Because Lamb waves are dispersive, the phase velocities of the Lamb waves vary with frequency, thickness of the substrate and the particular mode of interest. For plate thicknesses and Zophs wave lengths of practical significance, only first order symmetric and anti-symmetric Lamb waves are excited in the substrate 10. These first order mode Lamb waves have the characteristic that their energy distribution along an axis at right angles to the plane of the substrate is similar to that of a surface acoustic wave and therefore, these first order Lamb waves have a fractional sensitivity to touch that is also similar to surface acoustical waves. Because the phase and group velocities of the first order anti-symmetric and symmetric Lamb waves differ from each other undesirable effects can occur if one of the Lamb wave modes is not suppressed. For example, interference between the first order anti-symmetric and symmetric Lamb waves causes excessive variation in the output response. Further, when both modes are present, wave energy exits the transmitting arrays 28 and 34 at undesired angles as well as the desired angle. This causes the output signal of the sensor to exhibit multiple and excessive dips in response to touch so that the location of a touch cannot be determined. In order to suppress one of the Lamb wave modes, the bottom arrays 29 and 35 are aligned with respect to their respective top arrays 28 and 34 so as to reject the undesired Lamb wave mode.

Figure 5A:
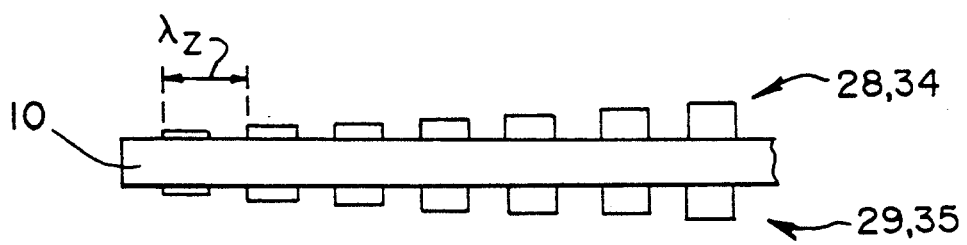
FIG. 5A is a partial side view of the sensor shown in FIG. 3 illustrating an aligned bottom array to suppress anti-symmetric Lamb waves.
Figure 5B:
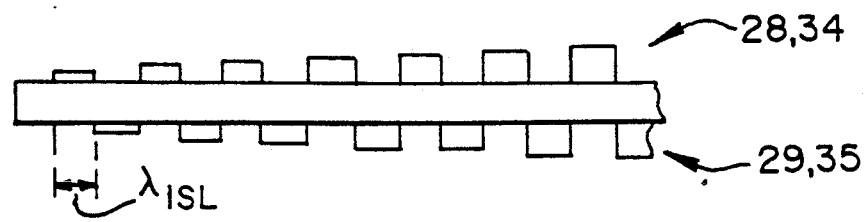
FIG. 5B is a partial side view of the sensor shown in FIG. 3 illustrating a shifted bottom array to suppress symmetric Lamb waves.

More particularly, the anti-symmetric Lamb wave mode can be canceled, reinforcing the symmetric Lamb wave mode by aligning the converting elements of the arrays 29 and 35 directly below the elements of the respective converting arrays 28 and 34 as shown in FIG. 5A. In order to suppress the symmetric Lamb wave mode and reinforce the anti-symmetric Lamb wave mode, the elements of the converting arrays 29 and 35 are displaced from the elements of the respective arrays 28 and 34 by the wavelength of the first order anti-symmetric Lamb wave divided by two i.e. $\lambda_{1aL}/2$. This latter embodiment is depicted in FIG. 5B. It is noted that in order to suppress symmetric Lamb wave modes the bottom array 29, 35 may be shifted along the axis of the top array 28, 34 or in a direction at right angles to the top array 28, 34. It is further noted that although a bottom array could be provided for the Lamb to shear converting arrays 30 and 36 and aligned in the same manner with the top arrays as discussed above for the arrays 28, 29 and 34, 35, a bottom array might not be necessary since the unwanted Lamb wave mode has already been suppressed by the transmitting arrays 28, 29 and 34, 35.

While it is desired to suppress one Lamb wave mode it is also desired to maximize the reinforcement of the other Lamb wave mode. However, because the phase velocity of the first order anti-symmetric Lamb wave is not equal to the phase velocity of the first order symmetric Lamb wave, there cannot be complete cancellation of one Lamb wave mode with maximum reinforcement of the other Lamb wave mode. In the preferred embodiment, the converting array elements are aligned for maximum rejection of the unwanted Lamb wave mode so that the greatest ratio of the desired mode to the unwanted mode occurs. Therefore, where the anti-symmetric mode is to be canceled, the elements of the bottom arrays 29 and 35 are aligned directly below the elements of the respective top arrays 28 and 34 wherein the spacing between adjacent elements in each of the arrays is equal to one wavelength of the Zophs wave propagating along the axis of the arrays. Where the symmetric mode is to be suppressed and the anti-symmetric mode reinforced, as a practical matter it is sufficient to align within 10% of one half of the wavelength of the first order anti-symmetric Lamb wave or approximately plus or minus 2 mils at 3 mHz which is within the alignment capabilities of silkscreening technology wherein the spacing between adjacent elements is equal to one wavelength of the Zohps wave.

In the preferred embodiment of the present invention, it is desired to suppress the first order symmetric Lamb wave and the Zohps wave since for touch position sensor substrates formed of glass with a thickness of between 20 and 60 mils and frequencies between 2 and 6 mHz, the symmetric mode is somewhat dispersive, whereas the anti-symmetric mode is only slightly dispersive. Since dispersion is undesirable, conversion of the Zohps wave to anti-symmetric Lamb waves is preferred for such substrates.

Figure 14:
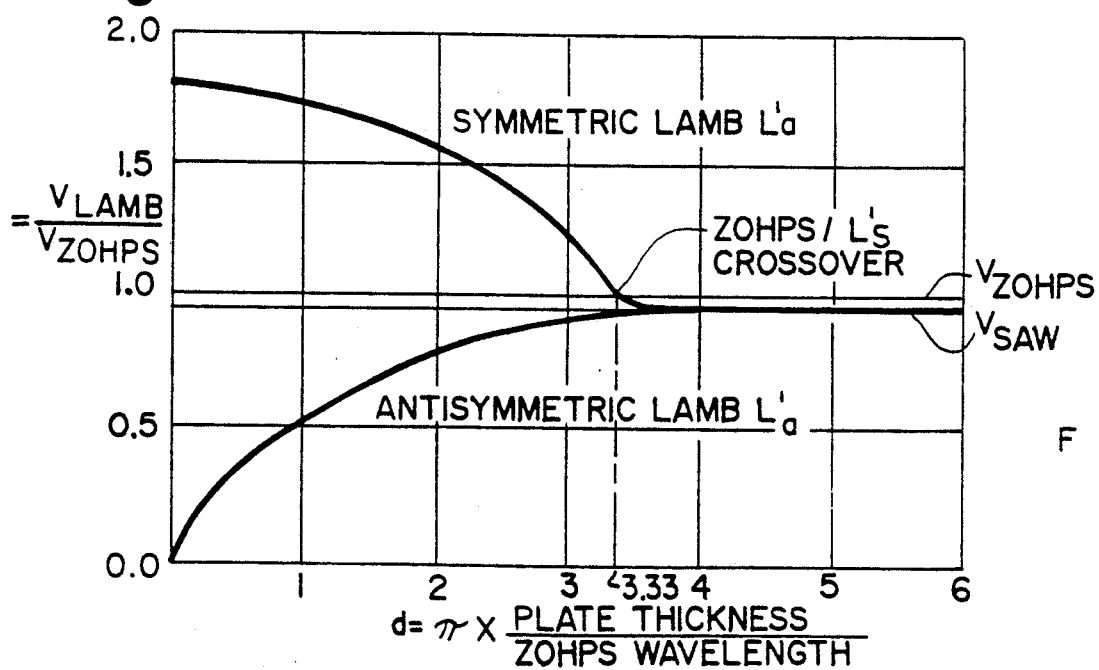
FIG. 14 is a graph of normalized phase velocity for first order Lamb waves versus normalized plate thickness for a soda-lime glass plate.

The configuration of the shear to Lamb converting arrays as discussed above is selected so as to suppress in the preferred embodiment the first order symmetric Lamb waves and Zohps waves. In general, this is not possible because the phase velocity of the Zohps wave is not equal to the phase velocity of the first order symmetric Lamb wave. However, as can be seen from FIG. 14, there is one value of d, the thickness of substrate 10 normalized to $\lambda_Z$, for which the phase velocity of the Zophs wave is equal to the phase velocity of the symmetric Lamb wave. This value of d is equal to 3.33. By setting d to this value and the angle of each of the converter elements $\theta_A$ equal to the arctangent of the phase velocity of the first order anti-symmetric Lamb wave divided by the phase velocity of the Zohps wave with the lower array shifted from the upper array by ½ of the wavelength of the first order symmetric Lamb wave, both the Zohps wave and the first order symmetric Lamb wave will be canceled. As an example, a touch position sensor 16 may be formed having: a soda-lime glass plate substrate 10 with a thickness of 40 mils (1 mm) where $\lambda_Z$ equals 37.7 mils; the frequency of the Zohps wave is equal to 3.58 mHz; the phase velocity of the first order anti-symmetric Lamb wave is equal to $0.9 V_Z$; the wavelength of the first order anti-symmetric Lamb wave is equal to 33.9 mils; and $\theta_A$ is equal to the arctangent of 0.9 which is equal to 42°, the top array being shifted by 18.9 mils from the bottom array where $\lambda_Z$ is equal to $X_{1SL}$ in this example.

Further, it is well known that wave energy tends to be confined in the lowest phase velocity regions. By selecting the first order anti-symmetric Lamb wave, the touch position sensor of the present invention can be operated at phase velocities of the anti-symmetric Lamb wave that are several orders of magnitude below the Zohps wave and even below the phase velocities of compressional modes in liquids. Because of this effect, by selecting a suitable operating frequency, the system can be made insensitive to specific surface contaminants. In addition, because of the low frequency of operation, it is possible to use a touch plate sensor that is thicker than would be desirable for a Zohps wave touch position sensor in applications where enhanced mechanical strength is important.

The arrays 28, 29, 30, 34, 35 and 36 may be formed of metal and bonded on to the top surface 40 of the substrate 10. However, in the preferred embodiment of the present invention, the reflective arrays are formed by silk screening frits on the top surface 40 of the substrate 10. The reflective array frits may be formed during the same cycle as the conductive frits used to bond the transducers to the substrate 10. As discussed above, each reflective element of the arrays 28, 30, 34 and 36 is disposed at an angle $\theta_A$ with respect to its axis and, preferably, the spacing between adjacent reflective elements is equal to one wavelength of the Zohps wave propagating along the arrays' axes. The width of each reflective array 28–29, 30, 34–35 and 36 is set equal to the width of the respective transducer where the drive signal applied to the transducer 18, 20, 22 and 24 is a sine wave, the number of cycles of which is equal to the array width divided by a constant as discussed above.

Figure 6:
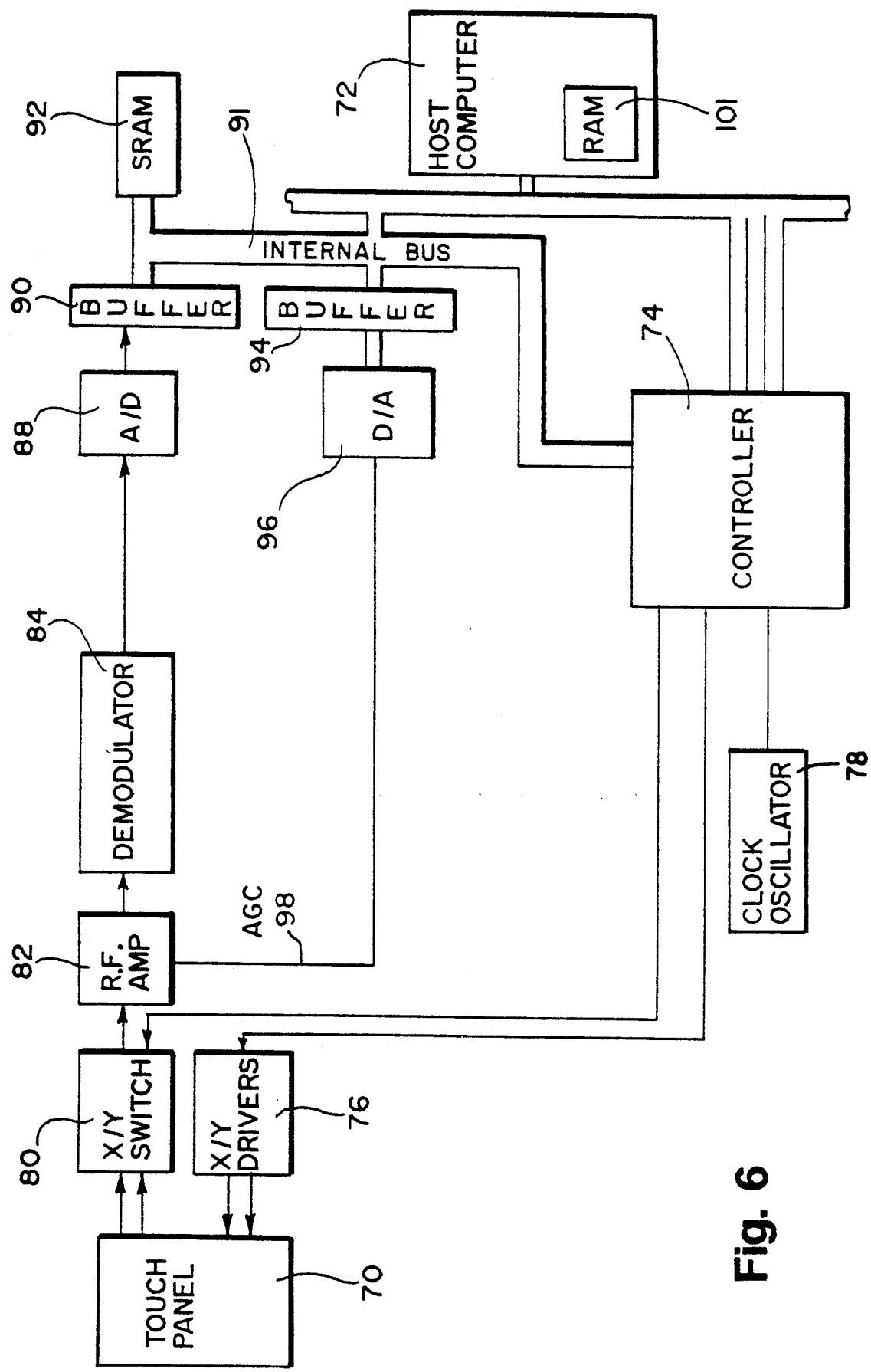
FIG. 6 is a block diagram illustrating the signal processing portion of the touch position sensor illustrated in FIG. 3.

In accordance with the preferred embodiment of the present invention, the technique employed to increase the power reflectivity at points along the arrays as the distance of the points along the array from the respective transducer increases employs variable height arrays as shown in FIGS. 5A-B. The height of each element in the converting arrays is such that the power reflectivity per unit length of the respective array, $\sigma(x)$ is given by $$\sigma(x) = \frac{\alpha}{(1 + \alpha/\sigma_L)\, e^{\alpha(L-x)} - 1} ; \qquad \text{eq. 3}$$

the ratio of the height of the array at x to the height of the first array element (x=0) is $$\frac{h(x)}{h(o)} = \left[ \frac{(1 + \alpha/\sigma_L)\, e^{\alpha L} - 1}{(1 + \alpha/\sigma_L)\, e^{\alpha(L-x)} - 1} \right]^{\frac{1}{2}} ; \text{ and} \qquad \text{eq. 4}$$

the ratio of the heights of the last array element and the first array element is $$\frac{h(L)}{h(o)} = \left[ \frac{(1 + \alpha/\sigma_L)\, e^{\alpha L} - 1}{\alpha/\sigma_L} \right]^{\frac{1}{2}} ; \qquad \text{eq. 5}$$

where $\alpha$ represents the power absorbtivity of the array per unit length, x is a variable representing the distance from the start of the array and L represents the length of the array. To design a variable height array, a practical value for the ratio of the maximum to minimum height, $h(L)/h(o)$, is determined and substituted into equation 4 to determine $\sigma_L$. Thereafter the values of $h(o)$ and $\sigma_L$ are substituted into equation 3 to determine the height of the array as a function of distance. With variable height arrays, the waveforms shown in FIG. 6 are obtainable wherein the amplitude of the Lamb waves propagated by the converting array elements is maintained substantially constant across the array in the absence of a touch.

The elements in the converting arrays 28, 29 and 30 define a number of paths of differing lengths such that Lamb waves propagated by each successive element in the array 28, 29 follow paths to the receiving transducer 20 that are progressively longer. Portions of each of the paths defined by the converting arrays 28, 29 and 30 extend in parallel across the substrate 10 in the Y direction, each parallel path portion defining an X coordinate. Similarly, the elements in the converting arrays 34, 35 and 36 define a number of paths of differing lengths such that Lamb waves propagated by each successive element in the array 34, 35 follow paths to the receiver 24 that are progressively longer. Portions of each of the paths defined by the arrays 34, 35 and 36 extend in parallel across the substrate 10 in the X direction, each parallel path portion defining a Y coordinate.

Figure 9:
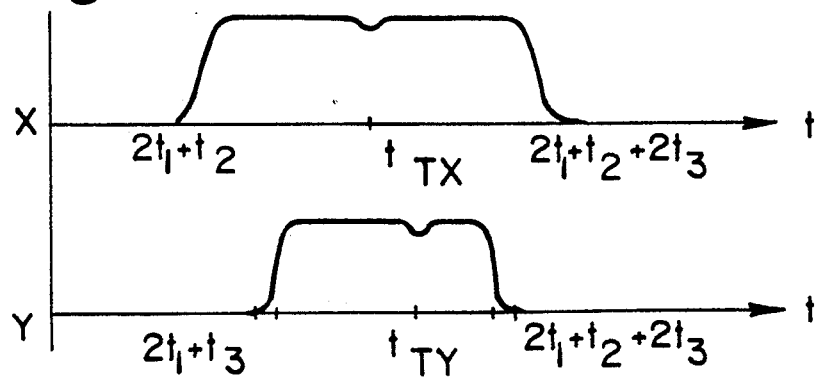
FIG. 9 is a graph illustrating the X and Y wave forms generated by the touch position sensor of FIG. 3.

The X and Y signals generated by the respective receiving transducers 20 and 24 are depicted in FIG. 9 wherein reflective arrays 28, 29, 30, 34, 35 and 36 of variable height are employed to provide X and Y signals whose amplitudes remain substantially constant with time as discussed above. With regard to the X axis signal, if a shear wave is generated by the transducer 20 beginning at time $t_0$, the first shear wave received by the transducer 20 occurs at a time equal to $2t_1 + t_2$ where $t_1$ is the time it takes a shear wave to travel from the substrate side 26 to the first element in the converting array 28 and also the time that it takes the shear wave to travel from the first element in the converting array 30 to the side 26 where it is sensed by the transducer 20. In the equation, $t_2$ represents the time it takes a Lamb wave to travel across the substrate 10 in the Y direction. The Lamb wave portion reflected by the last element in the converting array 28 and received by the last element in the converting array 30 is received by the transducer 20 at a time equal to the $2t_1 + t_2 + 2t_3$ wherein $t_3$ represents the time it takes a shear wave to travel in the X direction between the first element of the converting array 28 and the last element of the converting array 28 as well as the time it takes a shear wave to travel in the $-X$ direction between the last element of the converting array 30 and the first element thereof. Similarly, if the transducer 22 generates a shear wave at time $t_0$, the receiving transducer 24 receives the first wave converted by the arrays 34 and 36 at a time $2t_1 + t_3$ and the receiving transducer 24 receives the last wave converted reflected by the arrays 34, 36 at time $2t_1 + t_3 + 2t_2$. Each value of $t_X$ between $2t_1 + t_2$ and $2t_1 + t_2 + 2t_3$ represents a coordinate along the X axis; whereas, each value of $t_y$ between $2t_1 + t_3$ and $2t_1 + t_3 + 2t_2$ represents a coordinate along the Y axis. It is noted that in the preferred embodiment the time at which the drive signal is applied to the Y axis transmitting transducer 22 is at a time subsequent to the application of the drive signal to the X axis transmitting transducer 18 and also subsequent to the time that the X axis receiving transducer 20 receives the last shear wave reflected by the arrays 28 and 30.

A touch on the touch surface 37 of the substrate 10 will absorb a portion of the energy in the Lamb waves passing underneath the touched position. This partial absorption of energy creates a perturbation in the Lamb wave whose energy is absorbed, the perturbation being reflected in the amplitude of the signals generated by the receiving transducers 20 and 24. For example, the coordinates of a touch on the touch surface 37 of the substrate 10 are represented by the times of occurrence of the perturbations in the X and Y transducer signals depicted respectively at $t_{Tx}$, $t_{Ty}$ in FIG. 9.

The control system of the touch position sensor as shown in FIG. 6 controls the application of the drive signals to the transducers 18 and 22 and determines the coordinates of a touch on the substrate 10 from the times of occurrence $t_{Tx}$ and $t_{Ty}$ of the signal perturbations representing the touch. The touch panel 70 as shown in FIG. 5 is comprised of the substrate 10, the X and Y transmitting transducers 18 and 20, the X and Y receiving transducers 20 and 24 and the converting arrays 28, 29, 30, 34, 35 and 36. A host computer 72 that may include a microprocessor or the like initiates a scan cycle of the touch panel 70 by instructing a controller 74. The controller 74 is responsive to an initiate scan cycle instruction from the computer 72 to apply a drive signal to the X transmitting transducer 18 through an X driver 76 wherein the timing of the controller 74 is determined by a clock/oscillator 78. The drive signal applied to the transducer 18 is a burst drive signal in the form of a sine wave the number of cycles of which is equal to the width of the array 28 divided by a constant. The controller 74 also sets an X/Y switch 80 to the X position to couple the X receiving transmitter 20 to an R.F. amplifier 82. As the shear/Lamb waves converted by the arrays 28 and 30 are sensed by the transducer 20, the transducer 20 generates an X axis signal representative thereof that is coupled to the amplifier 82 through the switch 80. The amplified X axis signal output from the amplifier 82 is applied to a demodulator 84 that removes the burst drive signal from the amplified X axis signal to provide an envelope waveform such as depicted in FIG. 9. The output of the demodulator 84 is coupled to an analogue to digital converter 88 the output of which is coupled by a buffer 90 to an internal bus 91. The controller 74 stores the digital data output from the analogue to digital converter 88 in a static RAM 92 such that a value representing the amplitude of the X axis signal at each point in time $t_x$ as sampled by the analogue to digital converter 88 is stored in a location in the static RAM 92 representing the point in time. After the X axis data is stored in the static RAM 92, the controller 74 controls the Y driver 76 to apply a burst drive signal to the Y axis transmitting transducer 22 of the touch panel 70. The controller 74 also changes the state of the X/Y switch 80 so that the Y receiving transducer 24 is coupled to the R.F. amplifier 82. The digital data representing the Y axis signal as output from the analogue to digital converter 88 is likewise stored in the static RAM 92 such that a value representing the amplitude of the Y axis signal at each point in time $t_y$ as sampled by the analogue to digital converter 88 is stored in a location in the static RAM 92 representing the point in time.

Figure 7:
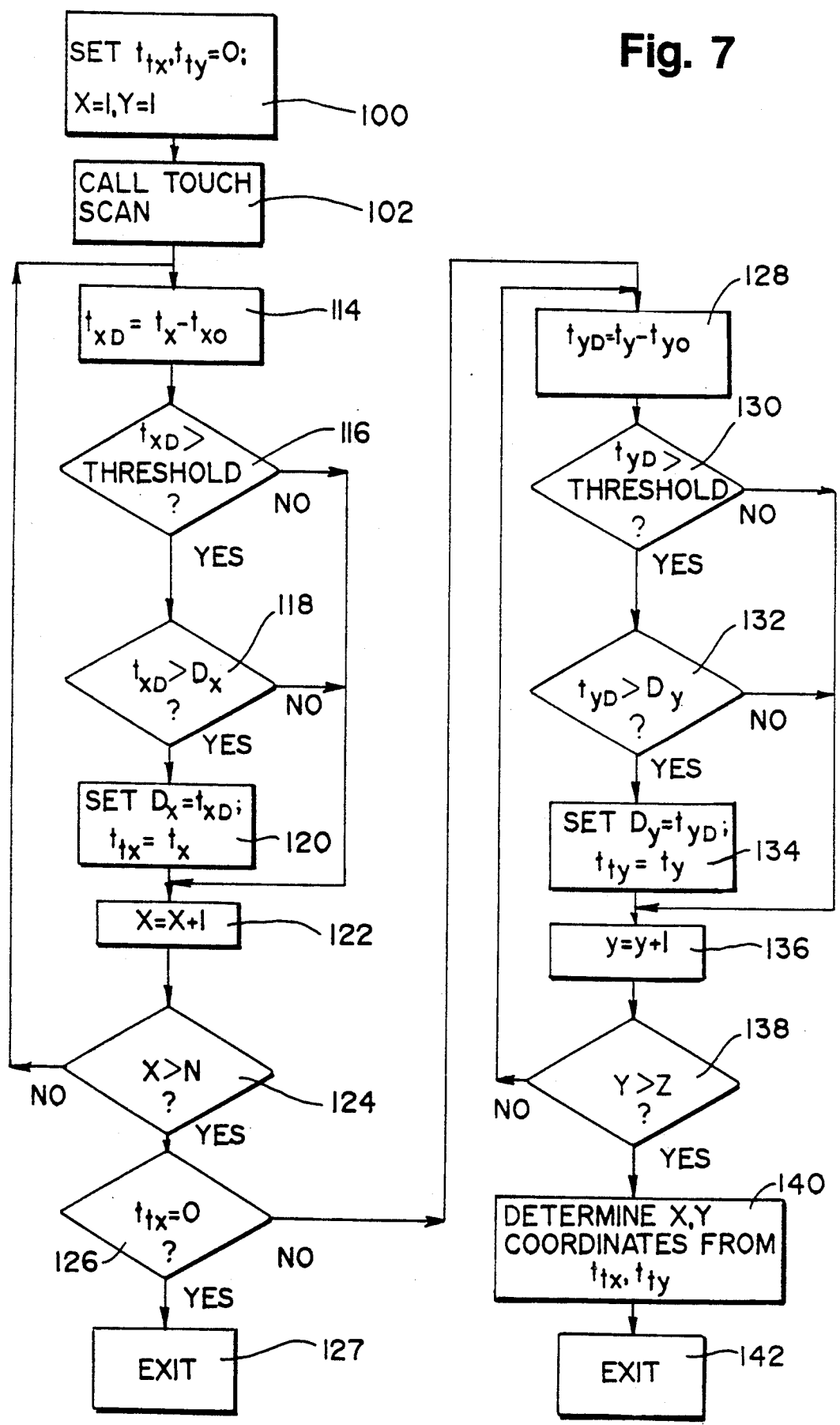
FIG. 7 is a flow chart illustrating the position determining operation of the sensor of the present invention.
Figure 8:
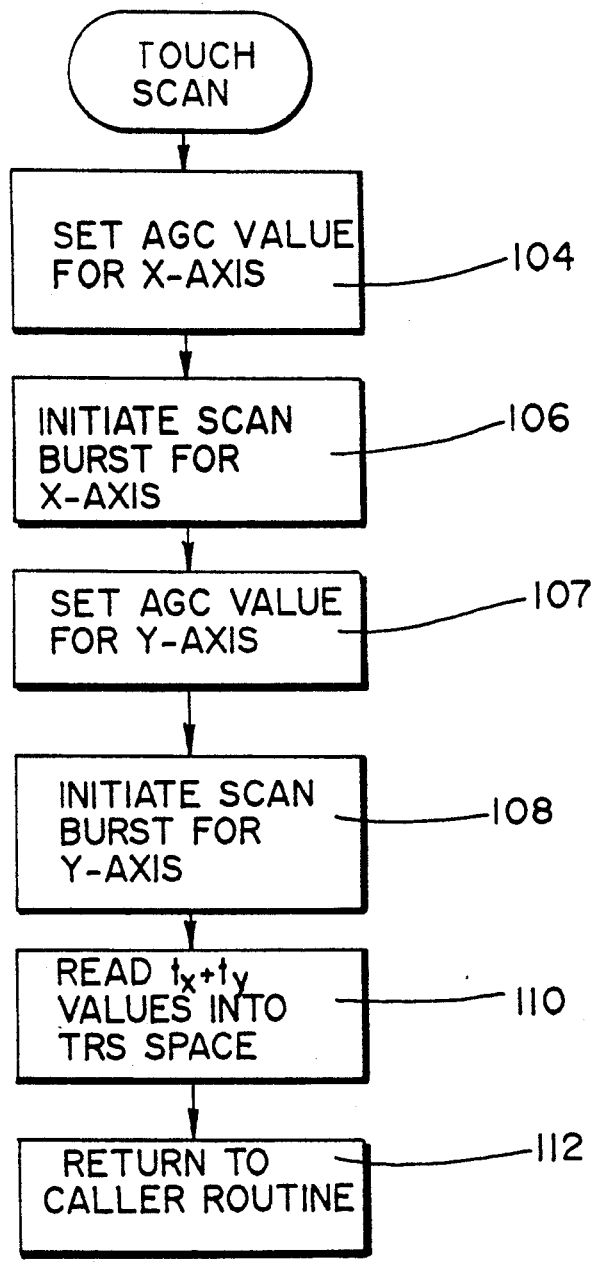
FIG. 8 is a flow chart illustrating the touch scan routine called by the software routine illustrated in FIG. 6.

The operation of the host computer 72 in determining the position of a touch on the touch panel 70 is illustrated in FIG. 7. During the initialization of the system, a scan cycle is performed for an untouched panel 70 with the X and Y amplitude values stored in the static RAM 92 for times $t_{xo}$ and $t_{yo}$. Thereafter, the X and Y amplitude values for each sampled point in time $t_{xo}$ and $t_{yo}$ are read out from the static RAM 92 and stored in a RAM 101 of the host computer 72. During an initialization process, the host computer 22 is responsive to the values stored in the RAM 101 for an untouched panel 70 for times $t_{xo}$ and $t_{yo}$, to set the gain on the R.F. amplifier 82 via a buffer 94 the output of which is coupled to a digital to analogue converter 96. After the initialization is performed, at a block 100 the host computer 72 sets the values of $t_{tx}$ and $t_{ty}$ equal to zero and the variables X and Y equal to 1. Thereafter, at block 102, the computer 72 calls a touch scan routine as shown in FIG. 8. The touch scan routine is a terminate and stay resident routine that is stored in the RAM 101 of the host computer 72. The host computer 72 in accordance with the touch scan routine at a block 104 sets the automatic gain control value for the R.F. amplifier 82 for the X axis to the value determined upon initialization. Thereafter, at block 106 the host computer 72 initiates a scan burst for the X axis by instructing the controller 74. After the X axis values for times $t_x$ are stored in the static RAM 92, the computer 72 at a block 107 sets the automatic gain control value for the Y channel and at block 108 instructs the controller 74 to initiate a scan for the Y axis. After the Y axis values for times $t_y$ are stored in the static RAM 92, the computer 72 at block 110 reads each of the amplitude values stored in the static RAM 92 for each sampled time $t_x$, $t_y$ into a terminate and stay resident area of the RAM 101. Thereafter at block 112, the computer 72 returns to the routine depicted in FIG. 7.

After the X and Y axis amplitude values for times $t_x$ and $t_y$ are read from the static RAM 92 into the RAM 101 of the host computer, the host computer 72 at block 114 determines a difference value $t_{xD}$ from the difference between the amplitude value stored for time $t_x$, wherein x was initialized to 1 at block 100, and the amplitude value stored for $t_{xo}$ i.e. for x=1, $t_{10}$, where At$_{10}$ represents the amplitude value stored for the first sampled time during the initialization routine. Thereafter, at block 116 the computer determines whether the difference value $t_{xD}$ is greater than a threshold value and if it is, the computer 72 at block 118 determines whether the difference value $t_{xD}$ is greater than $D_x$ which represents the greatest difference value detected for the X axis. If $t_{xD}$ is greater than $D_x$ the computer 72 at block 120 sets $D_x$ equal to the difference value $t_{xD}$ and sets the time of occurrence $t_{tx}$ of the difference value equal to $t_x$. At block 122 the computer 72 increments x by one and if x is not greater than N, the number of sampled time points for the X axis, as determined by the computer 72 at block 124, the computer 72 returns to block 114 to determine the next difference value. After difference values are determined at block 114 for each point in time sampled by the analogue to digital converter 88 and for which amplitude values are stored in the RAM 101, the computer 72 at block 126 determines whether $t_{tx}$, the time of occurrence of the greatest amplitude difference $D_x$, is equal to zero or not. If $t_{tx}$ is equal to zero indicating that no touch is detected on the X axis, the computer 72 exits the routine at a block 127. If however, the value of $t_{tx}$ is not equal to zero indicating a touch the time of occurrence of which is equal to $t_{tx}$, the computer 72 goes to block 128. At block 128, the computer 72 compares the amplitude stored at time $t_y$ to the initialization value stored for that same point in time $t_{yO}$ and stores the difference there between as $t_{yD}$. At block 130, the computer 72 compares $t_{yD}$ to a threshold and if $t_{yD}$ is greater than the threshold the computer 72 at block 132 compares $t_{yD}$ to $D_y$, the value of the greatest difference calculated at block 128 for the Y axis signal. Thereafter, at block 134 if $t_{yD}$ was determined to be greater than $D_y$ at block 132, the computer 72 at block 134 sets $D_y$ equal to $t_{yD}$ and the time of occurrence $t_{ty}$ of the greatest difference signal $D_y$ equal to $t_y$. At block 136 the computer 72 increments the variable y by one and at block 138 compares y to the number Z of sample points for the Y axis signal. If y is less than or equal to Z the computer 72 returns to block 128. If y is greater than Z indicating that a difference signal has been calculated for each sampled point on the Y axis, the computer 72 at block 140 determines the X and Y coordinates of a touch from the values of $t_{tx}$ and $t_{ty}$. Thereafter at block 142 the computer 72 exits the routine.

Figure 10:
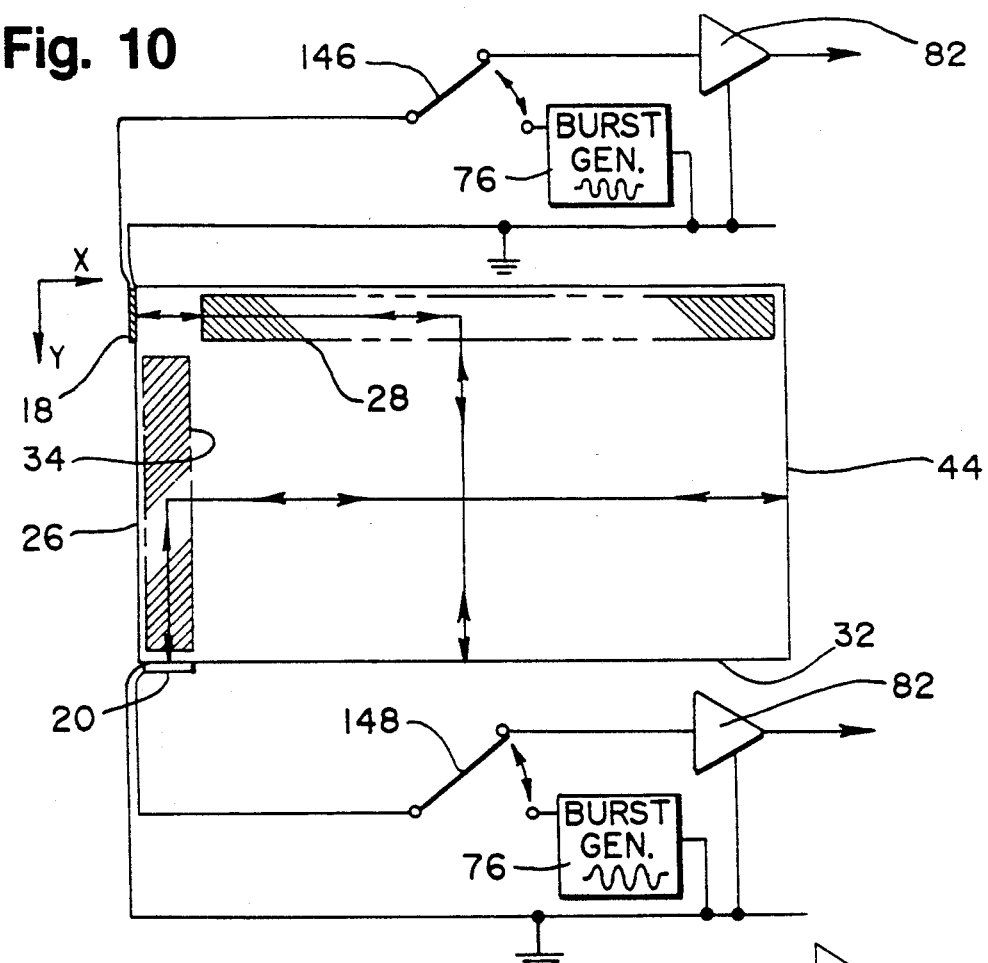
FIG. 10 is a top view of a second embodiment of the touch position sensor in accordance with the present invention.

A second embodiment of the touch position sensor of the present invention is shown in FIG. 10 and includes a single transducer for transmitting and receiving the shear waves associated with each axis, the coordinates of a touch on which is to be determined. Further, instead of having a Lamb to shear converting array for each of the X and Y axes as the embodiment depicted in FIG. 3, the touch position sensor shown in FIG. 8 includes a single converting array 28-29, 34-35 for each axis wherein the side 32, 44 of the substrate 10 opposite to each array 28-29, 34-35 is machined to provide a reflective edge. The reflective edge 32, 44 of the substrate 10 reflects the Lamb waves propagating perpendicular thereto without any appreciable loss in energy.

More particularly, the transducer 18 is coupled to a transmit/receive switch 146 that is controlled by the controller 74 to couple the X driver 76 or burst generator to the transducer 18 during a first time period to apply the drive signal thereto. The transducer 18 is responsive to the drive signal to impart a shear wave into the substrate 10 that propagates along the axis of the array 28. The reflective elements of the converting array 28-29 convert portions of the shear wave incident thereto to one mode of Lamb waves that propagate across the substrate 10 in the Y direction to the reflective edge 32 of the substrate 10. The substrate edge 32 reflects the Lamb waves propagating perpendicular thereto back to the array 28-29 which converts the reflected Lamb waves to shear waves propagating along the array's axis back to the transducer 18. After the drive signal is applied to the transducer 18, the controller changes the state of the transmit/receive switch 146 to the receive position wherein the transducer 18 is coupled to the R.F. amplifier 82 so that shear waves sensed by the transducer are coupled to the position detection circuitry.

Similarly, the transducer 20 is coupled to a transmit/receive switch 148 that is controlled by the controller 74 to couple the Y driver 76 to the transducer 20 during a second time period to apply the drive signal thereto. The transducer 20 is responsive to the drive signal to impart a shear wave into the substrate 10 that propagates along the is of the array 34-35. The elements of the converting array 34-35 convert portions of the shear wave incident thereto to one mode of Lamb waves that propagate across the substrate 10 in the X direction to the reflective edge 44 of the substrate 10. The substrate edge 44 reflects the Lamb waves propagating perpendicular thereto back to the reflective array 34-35 which in turn converts the Lamb waves to shear waves that propagate back to the transducer 20. After the drive signal is applied to the transducer 20, the controller changes the state of the transmit/receive switch 148 to the receive position wherein the transducer 20 is coupled to the R.F. amplifier 82 so that shear waves sensed by the transducer are coupled to the position detection circuitry.

Figure 11:
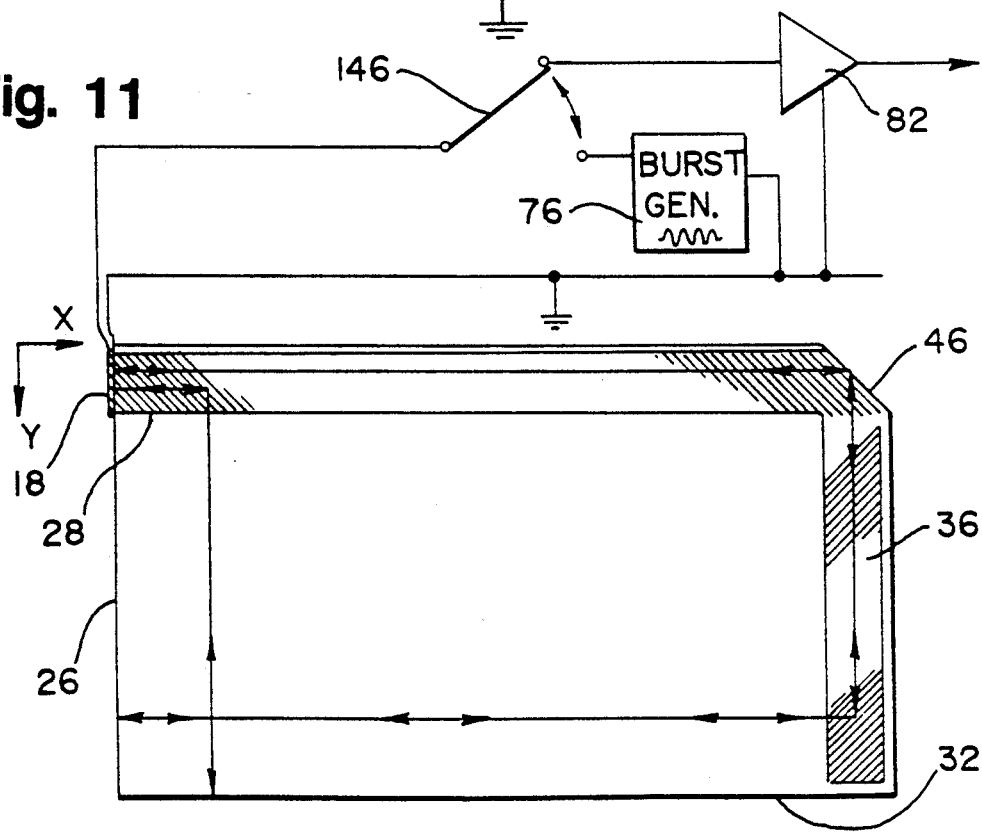
FIG. 11 is a third embodiment of the touch position sensor of the present invention.

A third embodiment of the touch position sensor of the present invention is shown in FIG. 11 and includes a single transducer for transmitting and receiving the shear waves associated with two perpendicular axes the coordinates of a touch on which are to be determined. In this embodiment, two converting arrays 28-29 and 34-35 are employed, a first converting array 28-29 extending along an axis perpendicular to the side 26 on which the transducer 18 is mounted and a second converting array 34-35 extending along an axis perpendicular to the axis of the first array 28-29 and adjacent to the end of the array 28-29. In order to couple a shear wave propagating along the axis of the converting array 28 to the converting array 34-35, the corner of the substrate 10 intersecting the axes of the arrays 28-29 and 34-35 is cut in order to provide a reflective edge 46 that is disposed at a 45° angle with respect to the adjacent sides 44 and 48 of the substrate 10. In response to a drive signal from the driver 76, the transducer 18 imparts a shear wave into the substrate 10 that propagates along the axis of the array 28, 29. The elements of the array 28, 29 convert portions of the shear wave to one mode of Lamb waves that propagates along a plurality of paths parallel to the Y axis to the side 32 of the substrate 10 wherein the side 32 is machined to provide a reflective edge. The side 32 of the substrate 10 reflects the Lamb waves propagating perpendicular thereto back to the array 28 which in turn converts the Lamb waves to shear waves propagating back to the transducer 18. When the shear wave propagating along the axis of the reflective array 28 meets the reflective edge 46, the edge 46 reflects the shear wave along the axis of the second array 36. The elements of the second array 36 convert portions of the shear wave to Lamb waves propagating along parallel paths across the substrate in the −X direction to the opposite side 26 of the substrate 10 which is machined to provide a second reflective edge. The substrate side 26 reflects the Lamb waves propagating perpendicular thereto back to the second converting array 36 which in turn converts the reflected Lamb waves to the shear waves that propagate back to the reflective edge 46. The reflective edge 46 then reflects the shear waves back to the transducer 18. The transducer 18 senses the shear waves reflected back thereto and provides a signal representative thereof. This mode of operation is designated the triple transit mode. It is noted, that in the preferred embodiment the transducer 18 is positioned on the side of the substrate 10 that is perpendicular to the axis of the longest reflective array so that there are no overlapping path lengths associated with the X array and the Y array.

Figure 12:
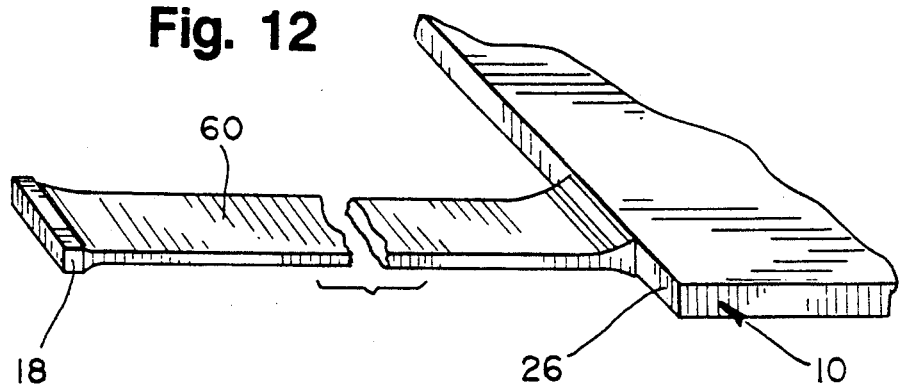
FIG. 12 is a partial perspective view of a sensor in accordance with the present invention wherein the substrate is coupled by an elongated flexible connector to a transducer.
Figure 13:
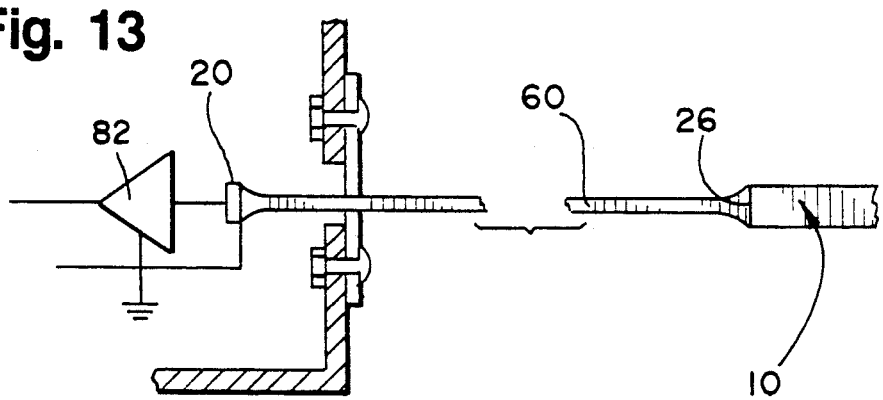
FIG. 13 is a side view of the transducer, substrate and connector shown in FIG. 12 wherein the transducer is shielded.

FIGS. 12 and 13 illustrate a flexible connector 60 that forms a Zohps mode transmission line. More particularly, the flexible connector 60 is formed of metal wherein the thickness of the connector bonded to the substrate 10 is equal to the thickness of the substrate, the thickness of the connector 60 reducing to a desired thinness a short distance from the edge of the substrate to which the connector is bonded, the distance being on the order of a few wavelengths of the Zohps wave. This embodiment has the advantage that there are no transducers or electrical wiring in the vicinity of the touch plate or substrate 10 so that the transducers may be brought inside the controller through a slit or the like in the wall of the controller's housing. Because the transducers are remote from the touch plate 10 electromagnetic radiation may be shielded from the transducer thus reducing pickup. Further, any radiation emanating from the transducer may be similarly shielded from external pickup. The flexible connector strip may be made as thin as 5 mils. Further a plastic sheathing may cover the connector 60 since the sheathing will not significantly dampen the Zohps wave propagating therein.

Since changes may be made in the above described apparatus without departing from the scope of the present invention, it is intended that the above description and drawing be interpreted as illustrative and not in a limiting sense. Further, the teachings of United States patent application Ser. No. 615,030, entitled, "Acoustic Touch Position Sensor," and filed concurrently herewith is incorporated herein by reference as an example of various modifications to the present invention coming within the scope of the invention.

What is claimed and desired to be secured by Letters Patent is:

1. A touch position sensor comprising:
   a substrate capable of supporting shear waves and Lamb wave propagating therein, said substrate having a touch surface;
   first means coupled to said substrate for imparting a shear wave into said substrate, said shear wave propagating along a first axis;
   first means disposed along said first axis for converting portions of said shear wave to Lamb waves propagating along first paths parallel to each other and extending across the touch surface of said substrate, each first path representing a different axial position, a touch on said substrate touch surface forming a perturbation in a Lamb wave propagating along a first path intersecting the position of said touch; and
   means for sensing the occurrence of a perturbation in said Lamb waves to determine the axial position of a touch on said substrate relative to said first axis.

2. A touch position sensor as recited in claim 1 wherein said converting means converts said shear wave into Lamb waves having a first mode and second mode, said converting means further including means for suppressing one of the said modes to prevent interference with the other of said modes.

3. A touch position sensor as recited in claim 2 wherein said first and second modes are symmetric and anti-symmetric Lamb wave modes and said suppressing means includes means for suppressing said symmetric Lamb wave mode.

4. A touch position sensor as recited in claim 2 wherein said first and second modes are symmetric and anti-symmetric Lamb wave modes and said suppressing means includes means for suppressing said anti-symmetric Lamb wave modes.

5. A touch position sensor as recited in claim 1 wherein said sensing means includes
   means disposed along an axis generally parallel to said first axis for converting said Lamb waves to shear waves; and
   means coupled to said substrate for receiving shear waves to provide a signal representative thereof.

6. A touch position sensor as recited in claim 5 wherein said imparting means includes a transmitting transducer coupled to a side of said substrate perpendicular to said first axis and said receiving means includes a transducer coupled to said substrate side spaced from said transmitting transducer and generally perpendicular to the axis of said Lamb to shear wave converting means.

7. A touch position sensor as recited in claim 1 wherein said substrate includes means disposed across said substrate touch surface from said converting means for reflecting Lamb waves propagating along said first paths back along said first paths to said converting means, said converting means converting said reflected Lamb waves to shear waves propagating along said first axis to said imparting means and said imparting means being responsive to shear waves propagated thereto to provide a signal representative of said shear waves, said signal being coupled to said sensing means.

8. A touch position sensor as recited in claim 1 further including
second means for imparting a shear wave into said substrate, said shear wave propagating along a second axis generally perpendicular to said first axis;
second means disposed along said second axis for converting portions of said shear wave propagating along said second axis to Lamb waves propagating along parallel paths extending across the touch surface of said substrate, each path representing a different axial position relative to said second axis, a touch on said substrate touch surface forming a perturbation in a Lamb wave propagating along a path intersecting the position of said touch;
said sensing means sensing the occurrence of a perturbation in said Lamb wave to determine the axial position of a touch on said substrate relative to said second axis.

9. A touch position sensor recited in claim 1 wherein said substrate is formed of glass.

10. A touch position sensor as recited in claim 9 wherein said glass is tempered.

11. A touch position sensor as recited in claim 9 wherein said glass is frosted.

12. A touch position sensor as recited in claim 1 wherein said substrate is formed of metal.

13. A touch position sensor as recited in claim 1 wherein said substrate is formed of plastic.

14. A touch position sensor as recited in claim 1 wherein said substrate is formed of a ceramic.

15. A touch position sensor as recited in claim 1 wherein said imparting means imparts a zeroth order horizontally polarized shear wave into said substrate.

16. A touch position sensor as recited in claim 15 wherein said imparting means includes a transducer, said transducer being coupled to said substrate by a flexible connector capable of transmitting said shear wave to allow said transducer to be positioned remote from said substrate.

17. A touch position sensor as recited in claim 16 wherein said flexible connector is formed of a metal strip.

18. A touch position sensor as recited in claim 17 wherein said metal strip has a variable thickness, the thickness of said strip adjacent to said plate being equal to the thickness of said plate.

19. A touch position sensor as recited in claim 17 further including a sheathing for said metal strip.

20. A touch position sensor as recited in claim 19 wherein said sheathing is plastic.

21. A touch position sensor as recited in claim 1 wherein said imparting means includes a transducer, a conductive frit bonding said transducer to said substrate.

22. A touch position sensor as recited in claim 21 wherein the height of said transducer is equal to the thickness of said substrate.

23. A touch position sensor comprising:
a substrate capable of supporting shear waves and Lamb waves propagating therein said substrating having a touch surface;
means coupled to said substrate for imparting a shear wave into said substrate, said shear wave propagating along a first axis;
a first array of converting elements disposed on said substrate along said first axis for converting said shear wave to Lamb waves having a symmetric mode and an anti-symmetric mode;
means disposed on said substrate relative to said first array for suppressing one of said modes, said converting means propagating the other of said modes along first parallel paths extending across the touch surface of said substrate, each first path representing a different axial position relative to said first axis and a touch on said substrate touch surface forming a perturbation in a Lamb wave propagating along a first path intersecting the position of said touch;
a second array of converting elements disposed along an axis generally parallel to said first axis for converting said Lamb waves to shear waves propagating along an axis generally parallel to said first axis, a perturbation in a Lamb wave forming a perturbation in the shear wave to which said Lamb wave is converted; and
means coupled to said substrate for sensing shear waves propagating along said parallel axis to provide a signal representative thereof; and
means responsive to said signal for determining the position of a touch on said substrate touch surface relative to said first axis.

24. A touch position sensor as recited in claim 23 wherein said first array is disposed on a first surface of said substrate and said suppressing means includes an array of converting elements disposed on a surface of said substrate opposite to said first surface and aligned with the elements of said first array to suppress said anti-symmetric mode.

25. A touch position sensor as recited in claim 23 wherein said first array is disposed on a first surface of said substrate and said suppressing means includes an array of converting elements disposed on a surface of said substrate opposite to said first surface and shifted relative to the first array by an amount approximately equal to the wavelength of a symmetric mode Lamb wave divided by two to suppress said symmetric mode.

26. A touch position sensor as recited in claim 25 wherein said shear waves are first order horizontally polarized shear waves, said Lamb waves are first order Lamb waves and the thickness of said substrate is set to a value for which the phase velocity of said shear wave is equal to the phase velocity of said first order symmetric Lamb wave.

27. A touch position sensor as recited in claim 25 wherein the elements of said suppressing array are shifted from the elements of said first converting array in the direction at right angles to said first axis.

28. A touch position sensor as recited in claim 25 wherein the elements of said suppressing array are shifted from the elements of said first converting array in a direction along said first axis.

29. A touch position sensor as recited in claim 23 further including
  second means coupled to said substrate for imparting a shear wave propagating along a second axis, said second axis intersecting said first axis;
  a third array of converting elements disposed along said second axis for converting portions of said shear wave to Lamb waves having a symmetric mode and an anti-symmetric mode;
  means disposed on said substrate relative to said third array for suppressing one of said modes, converting means propagating the other of said modes along second parallel paths extending across the touch surface of said substrate, each second path representing a different axial position relative to said second axis and a touch on said substrate touch surface forming a perturbation in a Lamb wave propagating along a second path intersecting the position of said touch;
  a fourth array of converting elements disposed along an axis generally parallel to said second axis for converting Lamb waves propagating on said second paths to shear waves propagating along an axis generally parallel to said second axis; and
  second means coupled to said substrate for sensing shear waves propagating along said axis parallel to said second axis to provide a signal representative thereof, said determining means being coupled to said sensing means to determine the position of a touch on said substrate touch surface relative to said second axis.

30. A touch position sensor as recited in claim 23 wherein said substrate is formed of glass.

31. A touch position sensor as recited in claim 30 wherein said glass is tempered.

32. A touch position sensor as recited in claim 30 wherein said glass is frosted.

33. A touch position sensor as recited in claim 23 wherein said substrate is formed of metal.

34. A touch position sensor as recited in claim 23 wherein said substrate is formed of plastic.

35. A touch position sensor as recited in claim 23 wherein said substrate is formed of a ceramic.

36. A touch position sensor as recited in claim 23 wherein said imparting means imparts a zeroth order horizontally polarized shear wave into said substrate and said converting means converts said shear waves to first order Lamb waves.

37. A touch position sensor as recited in claim 23 wherein said imparting means includes a transducer, said transducer being coupled to said substrate by a flexible connector capable of transmitting said shear wave to allow said transducer to be positioned remote from said substrate.

38. A touch position sensor as recited in claim 37 wherein said flexible connector is formed of a metal strip.

39. A touch position sensor as recited in claim 38 wherein said metal strip has a variable thickness, the thickness of said strip adjacent to said plate being equal to the thickness of said plate.

40. A touch position sensor as recited in claim 38 further including a sheathing for said metal strip.

41. A touch position sensor as recited in claim 40 wherein said sheathing is plastic.

42. A touch position sensor as recited in claim 23 wherein said imparting means includes a transducer, a conductive frit bonding said transducer to said substrate.

43. A touch position sensor as recited in claim 42 wherein the height of said transducer is equal to the thickness of said substrate.

44. A touch position sensor comprising:
  a substrate capable of supporting shear waves and Lamb waves propagating therein said substrating having a touch surface;
  means coupled to said substrate for imparting a shear wave into said substrate, said shear wave propagating along a first axis;
  a first array of converting elements disposed on said substrate along said first axis for converting said shear wave to Lamb waves having a symmetric mode and anti-symmetric mode;
  means disposed on said substrate relative to said first array for suppressing one of said modes, said converting means propagating the other of said modes along first parallel paths extending across the touch surface of said substrate, each first path representing a different axial position relative to said first axis and a touch on said substrate touch surface forming a perturbation in a Lamb wave propagating along a first path intersecting the position of said touch;
  means disposed generally parallel to said first axis and spaced from said first array for reflecting Lamb waves propagating along said first parallel paths back along said first parallel paths to said first array of converting elements, said converting elements converting said reflected Lamb waves to shear waves propagating along said first axis to said first imparting means and said first imparting means being responsive to shear waves propagated thereto to provide a signal representative of said shear waves; and
  means responsive to said signal for determining the position of a touch on said substrate relative to said first axis.

45. A touch position sensor as recited in claim 44 wherein said first array is disposed on a first surface of said substrate and said suppressing means includes an array of converting elements disposed on a surface of said substrate opposite to said first surface and aligned with the elements of said first array to suppress said anti-symmetric mode.

46. A touch position sensor as recited in claim 44 wherein said first array is disposed on a first surface of said substrate and said suppressing means includes an array of converting elements disposed on a surface of said substrate opposite to said first surface and shifted relative to the first array by an amount approximately equal to the wavelength of a symmetric mode Lamb wave divided by two to suppress said symmetric mode.

47. A touch position sensor as recited in claim 46 wherein said shear waves are first order horizontally polarized shear waves, said Lamb waves are first order Lamb waves and the thickness of said substrate is set to a value for which the phase velocity of said shear wave is equal to the phase velocity of said first order symmetric Lamb wave.

48. A touch position sensor as recited in claim 46 wherein the elements of said suppressing array are shifted from the elements of said first converting array in the direction at right angles to said first axis.

49. A touch position sensor as recited in claim 46 wherein the elements of said suppressing array are shifted from the elements of said first converting array in a direction along said first axis.

50. A touch position sensor as recited in claim 44 wherein said reflecting means includes a reflective edge of said substrate.

51. A touch position sensor as recited in claim 44 further including
second means coupled to said substrate for imparting a shear wave propagating along a second axis, said second axis intersecting said first axis;
a second array of converting elements disposed along said second axis for converting portions of said shear wave to Lamb waves having a symmetric mode and an anti-symmetric mode;
means disposed on said substrate relative to said second array for suppressing one of said modes, said converting means propagating the other of said modes along second parallel paths extending across the touch surface of said substrate, each of said second paths representing a different axial position relative to said second axis and a touch on said substrate touch surface forming a perturbation in a Lamb wave propagating along a second path intersecting the position of said touch;
means disposed generally parallel to said second axis and spaced from said second array for reflecting Lamb waves propagating along said second parallel paths back along said second paths to said second array of converting elements, said converting elements converting said reflected Lamb waves to shear waves propagating along said second axis to said second imparting means and said second imparting means being responsive to shear waves propagated thereto to provide a signal representative of said shear waves said position determining means being coupled to said second imparting means to determine the position of a touch on said substrate relative to said second axis.

52. A touch position sensor as recited in claim 44 wherein said substrate is formed of glass.

53. A touch position sensor as recited in claim 52 wherein said glass is tempered.

54. A touch position sensor as recited in claim 52 wherein said glass is frosted.

55. A touch position sensor as recited in claim 44 wherein said substrate is formed of metal.

56. A touch position sensor as recited in claim 44 wherein said substrate is formed of plastic.

57. A touch position sensor as recited in claim 44 wherein said substrate is formed of a ceramic.

58. A touch position sensor as recited in claim 44 wherein said imparting means imparts a zeroth order horizontally polarized shear wave into said substrate and said converting means converts said shear waves to first order Lamb waves.

59. A touch position sensor as recited in claim 44 wherein said imparting means includes a transducer, said transducer being coupled to said substrate by a flexible connector capable of transmitting said shear wave to allow said transducer to be positioned remote from said substrate.

60. A touch position sensor as recited in claim 59 wherein said flexible connector is formed of a metal strip.

61. A touch position sensor as recited in claim 60 wherein said metal strip has a variable thickness, the thickness of said strip adjacent to said plate being equal to the thickness of said plate.

62. A touch position sensor as recited in claim 60 further including a sheathing for said metal strip.

63. A touch position sensor as recited in claim 62 wherein said sheathing is plastic.

64. A touch position sensor as recited in claim 44 wherein said imparting means includes a transducer, a conductive frit bonding said transducer to said substrate.

65. A touch position sensor as recited in claim 64 wherein the height of said transducer is equal to the thickness of said substrate.

66. A touch position sensor comprising:
a substrate capable of supporting shear waves and Lamb waves propagating therein, said substrating having a touch surface;
means coupled to said substrate for imparting a shear wave into said substrate, said shear wave propagating along a first axis;
a first array of converting elements disposed on said substrate along said first axis for converting said shear wave to Lamb waves having a symmetric mode and anti-symmetric mode;
means disposed on said substrate relative to said first array for suppressing one of said modes, said converting means propagating the other of said modes along first parallel paths extending across the touch surface of said substrate, each of said first paths representing a different axial position relative to said first axis and a touch on said substrate touch surface forming a perturbation in a Lamb wave propagating along a first path intersecting the position of said touch;
means disposed generally parallel to said first axis and spaced from said first array for reflecting Lamb waves propagating along said first parallel paths back along said first parallel paths to said first array of converting elements, said converting elements converting said reflected Lamb waves to shear waves propagating along said first axis to said imparting means and said imparting means being responsive to shear waves propagated thereto to provide a signal representative of said shear waves;
a second array of converting elements disposed along a second axis intersecting said first axis for converting portions of a shear wave reflected thereto to Lamb waves having a symmetric mode and an anti-symmetric mode;
means for reflecting a shear wave propagating along said first axis to said second array for propagation along said second axis;
means disposed on said substrate relative to said second array for suppressing one of said modes, said converting means propagating the other of said modes along second parallel paths extending across the touch surface of said substrate, each of said second paths representing a different axial position relative to said second axis and a touch on said substrate touch surface forming a perturbation in a Lamb wave propagating along a second path intersecting the position of said touch;
means disposed generally parallel to said second axis and spaced from said second array for reflecting Lamb waves propagating along said second parallel paths back along said second paths to said second array of converting elements, said converting elements converting said reflected Lamb waves to shear waves propagating along said second axis to said reflecting means and said reflecting means reflecting said shear waves for propagation along said first axis to said imparting means, said imparting means being responsive to shear waves propagated thereto to provide a signal representative thereof; and means responsive to said signals for determining the position of a touch on said substrate touch surface relative to said first and second axes.

67. A touch position sensor as recited in claim 66 wherein said substrate is formed of glass.

68. A touch position sensor as recited in claim 67 wherein said glass is tempered.

69. A touch position sensor as recited in claim 67 wherein said glass is frosted.

70. A touch position sensor as recited in claim 66 wherein said substrate is formed of metal.

71. A touch position sensor as recited in claim 66 wherein said substrate is formed of plastic.

72. A touch position sensor as recited in claim 66 wherein said substrate is formed of a ceramic.

73. A touch position sensor as recited in claim 66 wherein said imparting means imparts a zeroth order horizontally polarized shear wave into said substrate and said converting means converts said shear waves to first order Lamb waves.

74. A touch position sensor as recited in claim 66 wherein said imparting means includes a transducer, said transducer being coupled to said substrate by a flexible connector capable of transmitting said shear wave to allow said transducer to be positioned remote from said substrate.

75. A touch position sensor as recited in claim 74 wherein said flexible connector is formed of a metal strip.

76. A touch position sensor as recited in claim 75 wherein said metal strip has a variable thickness, the thickness of said strip adjacent to said plate being equal to the thickness of said plate.

77. A touch position sensor as recited in claim 75 further including a sheathing for said metal strip.

78. A touch position sensor as recited in claim 77 wherein said sheathing is plastic.

79. A touch position sensor as recited in claim 66 wherein said imparting means includes a transducer, a conductive frit bonding said transducer to said substrate.

80. A touch position sensor as recited in claim 79 wherein the height of said transducer is equal to the thickness of said substrate.

* * * * *